(12) United States Patent
Zmijewski

(10) Patent No.: US 10,380,316 B2
(45) Date of Patent: Aug. 13, 2019

(54) SYSTEM AND METHOD FOR VISUALIZATION OF A MECHANICAL INTEGRITY PROGRAM

(71) Applicant: Haag Engineering Co., Irving, TX (US)

(72) Inventor: Christopher M. Zmijewski, Mount Laurel, NJ (US)

(73) Assignee: Haag Engineering Co., Flower Mound, TX (US)

( * ) Notice: Subject to any disclaimer, the term of this patent is extended or adjusted under 35 U.S.C. 154(b) by 616 days.

(21) Appl. No.: 15/019,643

(22) Filed: Feb. 9, 2016

(65) Prior Publication Data

US 2016/0232277 A1 Aug. 11, 2016

Related U.S. Application Data

(60) Provisional application No. 62/114,037, filed on Feb. 9, 2015.

(51) Int. Cl.
 *G06F 17/50* (2006.01)

(52) U.S. Cl.
 CPC ................. *G06F 17/5086* (2013.01)

(58) Field of Classification Search
 CPC .................................................. G06F 17/5086
 USPC .............................................................. 703/7
 See application file for complete search history.

(56) References Cited

U.S. PATENT DOCUMENTS

| | | | |
|---|---|---|---|
| 7,583,275 B2 | 9/2009 | Neumann et al. | |
| 7,978,192 B2 | 7/2011 | Elsberg et al. | |
| 8,396,255 B2 | 3/2013 | Kmiecik et al. | |
| 9,222,771 B2 * | 12/2015 | Rosengaus | G01C 15/002 |
| 2008/0111815 A1 | 5/2008 | Graves et al. | |
| 2013/0096873 A1 | 4/2013 | Rosengaus et al. | |
| 2013/0155058 A1 | 6/2013 | Golparvar-Fard et al. | |
| 2014/0043436 A1 | 2/2014 | Bell et al. | |

FOREIGN PATENT DOCUMENTS

| | | |
|---|---|---|
| WO | 2013141922 | 9/2013 |
| WO | 2014020364 | 2/2014 |

OTHER PUBLICATIONS

LandAir Surveying Company. Land Air Surveying. http://www.landairsurveying.com/bim-technology/. Copyright 2014 LandAir Surveying Company, pp. 1-3.

* cited by examiner

*Primary Examiner* — Brian S Cook
(74) *Attorney, Agent, or Firm* — Scott T. Griggs; Griggs Bergen LLP

(57) ABSTRACT

A system and method for visualization of a mechanical integrity program are disclosed. In one embodiment, a mechanical integrity program server is configured to provide design, assurance, and verification functions that ensure a site, or a site under development, meets appropriate and intended requirements. Based on point cloud data and digital imagery collected from the site, a composite model file is built. Operational elements, interconnection of the operational elements, and instrumentation of the site are identified within the composite model file. Responsive to user input, a mechanical integrity program is generated including processes for assuring the site is in satisfactory condition to safely and reliably perform its intended purpose. Various field interface modes for viewing on a programmable interactive device permit field inspection of the site.

22 Claims, 11 Drawing Sheets

SYSTEM AND METHOD FOR VISUALIZATION OF A MECHANICAL INTEGRITY PROGRAM

PRIORITY STATEMENT & CROSS-REFERENCE TO RELATED APPLICATIONS

This application claims priority from U.S. Patent Application No. 62/114,037 entitled "System and Method for Visualization of a Mechanical Integrity Program" filed on Feb. 9, 2015, which is hereby incorporated by reference for all purposes.

TECHNICAL FIELD OF THE INVENTION

This invention relates, in general, to mechanical integrity programs and, in particular to systems and methods for visualization of mechanical integrity programs that applies various engineering disciplines associated with the design, assurance, and verification functions that ensure a facility meets its appropriate and intended requirements.

BACKGROUND OF THE INVENTION

Accurate and efficient tracking of proposed or as-built structures and the accompanying actual statuses has been repeatedly reported as a critical factor for the success of project control, including construction oversight and operations and maintenance. Despite the importance of monitoring, processing and representation are time-consuming and labor-intensive. In particular, existing techniques make it difficult and expensive to further analyze and visualize the as-built structures and their respective statuses. Improvements are needed.

SUMMARY OF THE INVENTION

It would be advantageous to fully analyze and visualize facilities, products, processes, and systems before the facility is fully constructed, or after as an as-built facility. It would also be desirable to enable a computer-based solution that would improve efficiency and effectiveness of mechanical integrity programs while reducing labor. To better address one or more of these concerns, a system and method for visualization of mechanical integrity programs is disclosed that applies various engineering disciplines associated with the design, assurance, and verification functions that ensure a facility during construction or an as-built facility, for example, meets its appropriate and intended requirements.

In one embodiment of the system, a mechanical integrity program server is configured to provide design, assurance, and verification functions that ensure a site meets appropriate and intended requirements. Based on point cloud data and imagery collected from an under construction or as-built site, for example, a composite model file is built and operational elements, interconnection of the operational elements, and instrumentation of the as-built site are identified within the composite model file. Responsive to user input, a mechanical integrity program is generated including processes for assuring the site, which may be under construction or as-built, is in satisfactory condition to safely and reliably perform its intended purpose. In one embodiment, various field interface modes for viewing on a programmable interactive device permit field inspection of the as-built site. These and other aspects of the invention will be apparent from and elucidated with reference to the embodiments described hereinafter.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The specific embodiments discussed herein are merely illustrative of specific ways to make and use the invention, and do not delimit the scope of the present invention.

Figure 1:
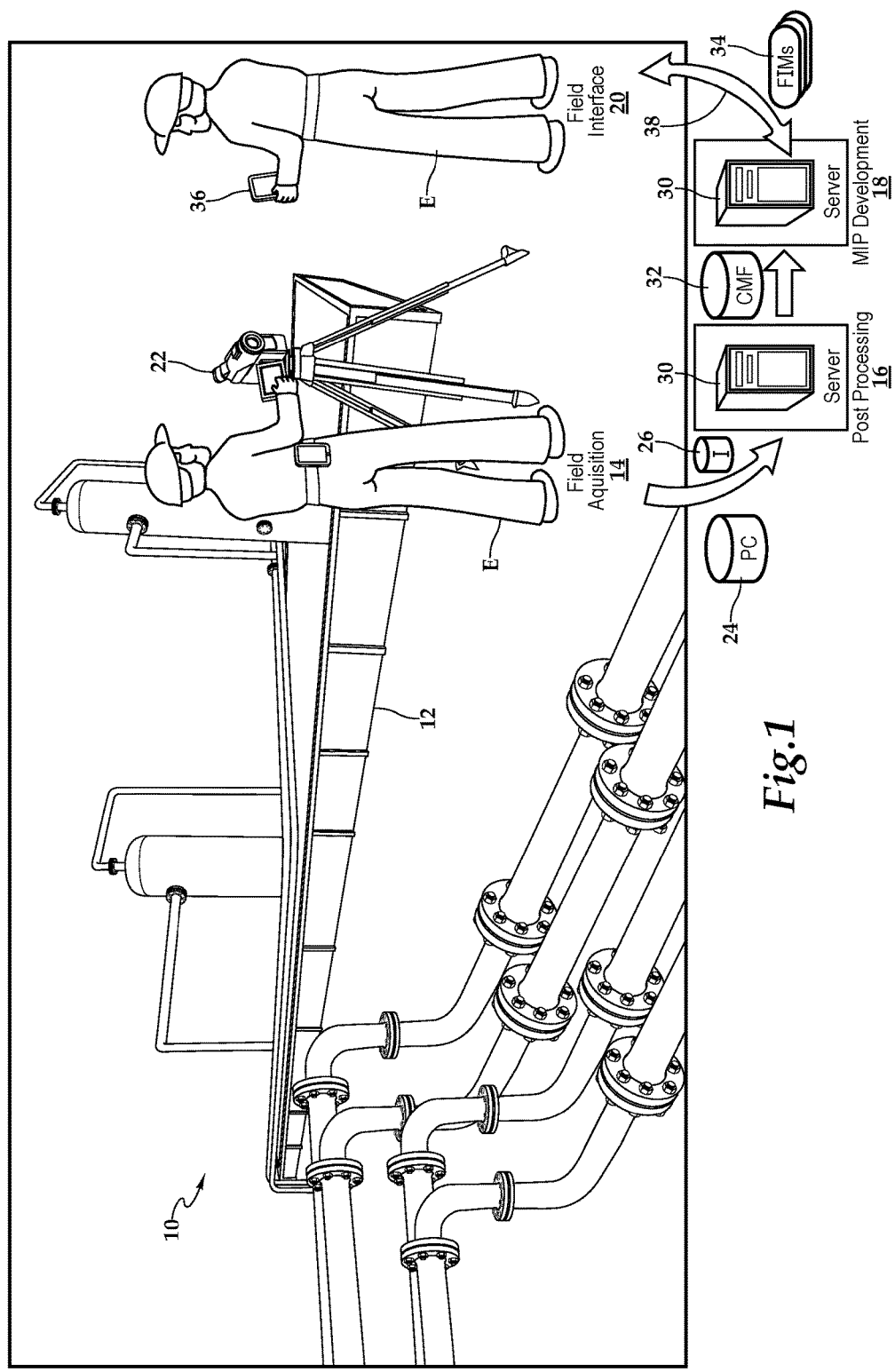
FIG. 1 is a schematic block diagram depicting one embodiment of a system for visualization of mechanical integrity program according to the teachings presented herein.

Referring initially to FIG. 1, therein is depicted one embodiment of a system for visualization of mechanical integrity programs that is schematically illustrated and designated 10. The system 10 is being utilized at an as-built site, which is depicted as oil field production site 12. At this oil field production site 12, a mechanical integrity program is being implemented that provides design, assurance, and verification functions that ensure the as-built site meets appropriate and intended requirements. It should be appreciated that although FIG. 1 depicts an as-built site, the teachings presented herein are applicable to sites under development and construction, for example, as well. In one embodiment, the mechanical integrity program includes four stages; namely, field acquisition 14, post-processing 16, mechanical integrity program (MIP) development 18, and field interface 20.

Referring to field acquisition 14, an engineer E is utilizing a field acquisition subsystem 22 to document the as-built conditions at the oil field production site 12. In one implementation, the field acquisition subsystem 22 includes laser scanning equipment that laser scans the oil field production site 12 to collect point cloud data of the as-built site. The field acquisition subsystem 22 also includes digital imagery equipment such as video equipment or spherical photography equipment which collects imagery of the as-built site.

Following field acquisition 14, point cloud (PC) data 24 and imagery data (I) 26 are provided to a MIP server 30 in post-processing 16. During post-processing 16, a composite model file (CMF) 32 is developed prior to the development of the mechanical integrity program at MIP development 18. During mechanical integrity program development at the MIP server 30, operational elements, interconnection of the operational elements, and instrumentation of the as-built site are identified within the composite model file 32. Responsive to user input at the MIP server 30, a mechanical integrity program is generated including processes for assuring the as-built site is in satisfactory condition to safely and reliably perform its intended purpose. In one embodiment, the result of the MIP development 18 is field interface modules (FIM) 34, which at the stage of field interface 20 may be used for viewing on a programmable interactive device 36, via communication link 38, to permit field inspection of the as-built site as shown by engineer E utilizing the programmable interactive device 36 to perform an inspection in conjunction with the MIP implemented. In one embodiment, the communication link 38 may be the Internet. It should be appreciated that although an as-built site is depicted in FIG. 1, the teachings herein are not limited to as-built sites and include any type of site.

Figure 2:
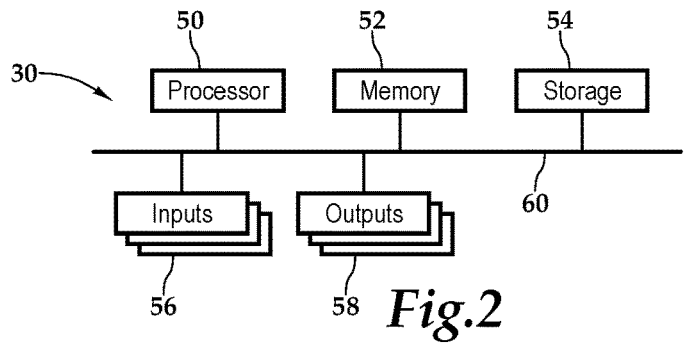
FIG. 2 is a schematic block diagram depicting one embodiment of a mechanical integrity program server shown in FIG. 1 in further detail.

Referring now to FIG. 2, a schematic block diagram is illustrated depicting the MIP server 30 in further detail. A computing device, which may be the MIP server or distributed among several servers, for example, includes a processor 50, memory 52, storage 54, inputs 56, and outputs 58 interconnected with various buses 60 in a common or distributed, for example, mounting architecture. In other implementations, in the computing device, multiple processors and/or multiple buses may be used, as appropriate, along with multiple memories and types of memory. Further still, in other implementations, multiple computing devices may be provided and operations distributed therebetween. The processor 50 may process instructions for execution within the computing device, including instructions stored in the memory 52 or in the storage 54. The memory 52 stores information within the computing device. In one implementation, the memory 52 is a volatile memory unit or units. In another implementation, the memory is a non-volatile memory unit or units. The storage 54 provides capacity that is capable of providing mass storage for the computing device. Various inputs 56 and outputs 58 provide connections to and from the computing device, wherein the inputs 56 are the signals or data received by the computing device, and the outputs 58 are the signals or data sent from the computing device. As mentioned, the inputs 56 and the outputs 58 may include communication links, such as the communication link 38. It should be appreciated that although a particular architecture is explained, other designs and layouts are within the teachings presented herein.

As discussed, the memory 52 is accessible to the processor 50 and the memory 52 includes processor-executable instructions that, when executed, cause the processor 50 to process the point cloud data and imagery to create a composite model file. In one embodiment, the composite model file is a three-dimensional (3D) representation of the as-built site having geospatial positioning therein. Further, the processor 50 may store in memory multiple raw images obtained from the point cloud data and imagery taken at the as-built site which as previously discussed, may be simply a site in some applications of the teachings presented herein. Then, the processor 50 may process the multiple raw images to construct a dense three-dimensional (3D) model including merged pixels from point cloud data and imagery. Following this step, the instructions may cause the processor to rectify and transform the dense three-dimensional (3D) as-built model to a site coordinate system including geospatial positioning, thereby generating the composite model file.

In one implementation, the geospatial positioning may include global positioning satellite coordinates. Further, the instructions may cause the processor to identify operational elements of the as-built site within the composite model file, identify the interconnection of the operational elements of the as-built site within the composite model file, and identify the instrumentation of the as-built site used to the control the operational elements within the composite model file. The operational elements, interconnection, and instrumentation of the as-built site may include piping and instrumentation elements. In another embodiment, the operational elements, interconnection, and instrumentation of the as-built site may include components from building and mechanical elements, electrical elements, plumbing and/or structural elements.

As mentioned, the memory 52 includes processor-executable instructions that, when executed, cause, responsive to user input, the processor 50 to further identify and isolate subsystems of the interconnected operational elements and instrumentation of the as-built site within the composite model file. Then the instruction-processor combination may create label attributes within the composite model file. Each label attribute corresponds to a physical label on the operational equipment or the instrumentation.

Responsive to user input, the instructions in the memory 52 cause the processor 50 to generate a mechanical integrity program including processes for assuring the as-built site is in satisfactory condition to safely and reliably perform its intended purpose. The mechanical integrity program may include an inspection schedule, which has a calendar component. Further, the processor 50 is caused by the instructions to integrate enhanced inspection points into the composite model file. Each enhanced inspection point is a part of the inspection schedule. The enhanced inspection points may include navigatable, user-accessible embedded attributes. Moreover, a portion of the enhanced inspection points may include data such as measured value of operation, measured value modifier of operations, passive readout functions, active output functions, and function modifiers, for example.

Thereafter, the instruction-processor combination may provide a first field interface mode configured for viewing on the programmable interactive device. The first field interface mode may include a first-person point cloud view of the as-built site having tag attributes and enhanced inspection points therein. The instruction-processor combination also provides a second field interface mode configured for viewing on the programmable interactive device. The second field interface mode includes a system view of the as-built site having tag attributes and enhanced inspection points therein. A third field interface mode is also provided by the instruction-processor combination and configured for viewing on the programmable interactive device. The third field interface mode may include a subsystem view of the as-built site having tag attributes and enhanced inspection points therein. The processor provides a transitioning between the first field interface mode, the second field interface mode, and the third field interface mode. Following use in the field, the instructions in the memory 52 cause the processor 50 to receive inspection data relative to the inspection points from the programmable interactive device, and responsive to user input, the processor provides an update of the mechanical integrity program based on the inspection data.

Figure 3:
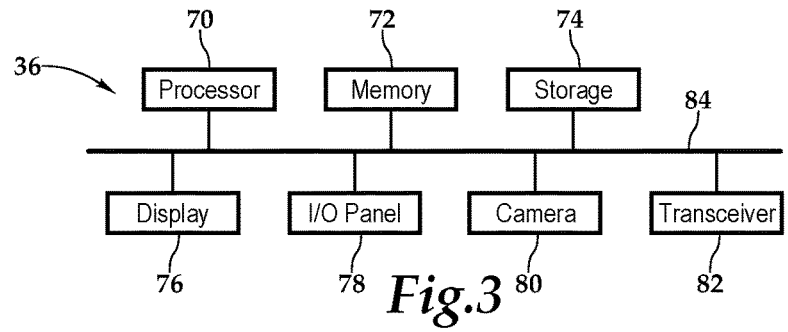
FIG. 3 is a schematic block diagram depicting one embodiment of a wireless-enabled interactive handheld programmable device shown in FIG. 1 in further detail.

Referring now to FIG. 3, the programmable interactive device 36 may be a wireless communication device of the type including various fixed, mobile, and/or portable devices. To expand rather than limit the previous discussion of the interactive programmable device 36, such devices may include, but are not limited to, smart phones, personal digital assistants, Global Position System (GPS)-based units, laptop computers, desktop computers, and so forth. The programmable interactive device 36 may include a processor 70, memory 72, storage 74, display 76, I/O panel 78, camera 80, and transceiver 82; all of which are interconnected by a busing architecture 84. It should be appreciated that although a particular architecture is explained, other designs and layouts are within the teachings presented herein.

In operation, the teachings presented herein permit a programmable interactive device 36 to be utilized as a field interface for the MIP. The memory 72 is accessible to the processor 70 and the memory 72 includes processor-executable instructions that, when executed, cause the processor 70 to user-selectively display one of the first field interface mode, the second field interface mode, and the third field interface mode. The instruction-processor combination causes the interactive programmable device to display the enhanced inspection points in response to user requests and thereafter, the interactive programmable device transmits data relative to the inspection points from the programmable interactive device 36 to the MIP server 30.

Figure 4A:
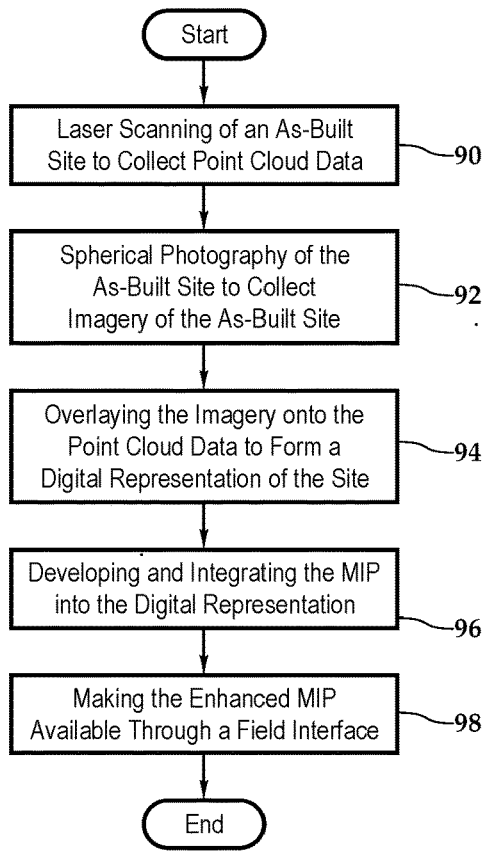
FIG. 4A is a flow chart of one embodiment of a method for visualization of a mechanical integrity program according to the teachings presented herein.

Referring now to FIG. 4A, a flow chart of one embodiment of a method for visualization of the MIP is depicted. At block 90, during field acquisition, a laser scanning of a site, such as an as-built site, to collect point cloud data is performed. At block 92, field acquisition continues and digital imagery such as a site being developed or spherical photography of the as-built site to collet imagery of the as-built site occurs. At block 94, post-processing begins with the overlying of the imagery onto the point cloud data to form a digital representation of the site with accurate physical and functional characteristics. Post-processing continues at block 96, where developing and integrating the MIP into the digital representation continues. Following post-processing, at the field interface stage, the enhanced MIP is made available through a field interface at block 98.

Figure 4B:
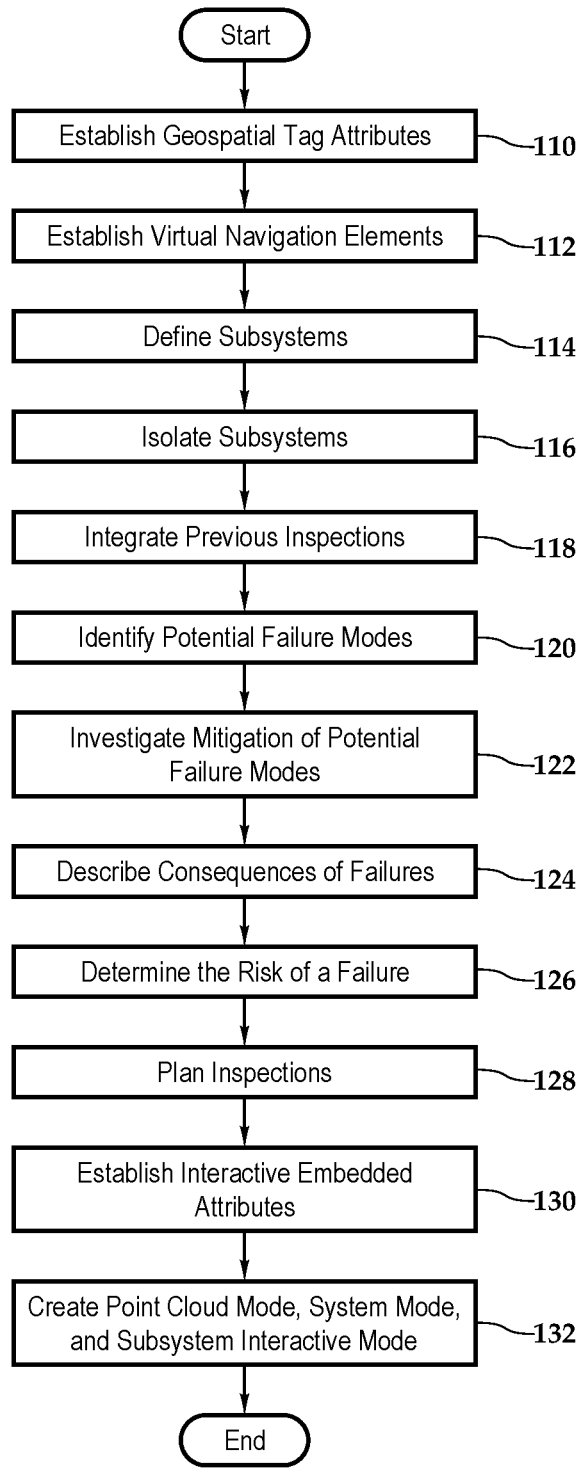
FIG. 4B is a flow chart depicting one embodiment of a methodology for developing the mechanical integrity program shown in FIG. 4 in further detail.

Referring now to FIG. 4B, a flow chart of a methodology for developing the MIP is depicted. In one embodiment, FIG. 4B expands upon block 96 of FIG. 4A. Continuing with reference to FIG. 4B, at block 110, geospatial tag attributes are established within the MIP. As previously discussed, the geospatial tag attributes correspond to physical tags and labels located on operational elements at the as-built site. At block 112, virtual navigation elements are established by defining subsystems block 114 and isolating subsystems block 116. At block 118, previous inspection reports are integrated into the MIP development. At block 120, potential failure modes are identified in each operational element and instrumentation associated therewith. By way of example and not by way of limitation, failure modes investigate fatigue, internal corrosion, external corrosion, high temperature creep, metal embrittlement, flow induced vibrations, externally induced vibrations, excessive pressure, excessive temperature (low or high), loosening or failure of support bolts or other support materials, or combinations thereof, for example.

At block 122, all of the potential failure modes are identified that can be mitigated by operational procedures and management practices. At block 124, if there is a failure of an operational element or instrumentation, the consequences of the failure are documented with respect to safety, regulatory requirements, and plant reliability, for example. At block 126, the risks of particular failures are determined and at block 128, inspections are planned. At block 130, interactive embedded attributes are established with the MIP. At block 132, point cloud interactive mode, system interactive mode, subsystem interactive mode, and visual interface interactive mode for the field interface are created.

As described above, a mechanical integrity program includes processes for assuring the as-built site is in satisfactory condition to safely and reliably perform its intended purpose. Further, the mechanical integrity program also includes an inspection schedule to accomplish these goals. Although the teachings presented herein have been illustrated and described with respect to an as-built site being an oil field production facility or more generally piping and instrumentation elements, it should be appreciated that the MIP presented herein is not limited to oil field production facilities or piping and instrumentation. The following table, Table I, presents non-limiting applications of the MIP system presented herein with various size, material, service, subsystem, and inspection criteria. It should further be appreciated that the teachings herein apply to various types of sites, including the aforementioned as-built sites and sites under development, for example.

TABLE I

Exemplary MIP Applications

| Size | Material | Service | Subsystem | Inspection |
|---|---|---|---|---|
| Oil and Gas: | | | | |
| 3" pipe (geospatially located) | Carbon Steel with attribute tag information | Produced liquid (from attribute tag) | Above ground/ below ground | Ultrasonic testing including forms and schedule |
| 3" butterfly valve (geo located) | Pressure class with attribute tag information | Produced liquid (from attribute tag) | Above ground/ below ground | Radiographic testing |
| 60" × 10' Production Separator (geo located) | Stainless Steel with attribute tag information | Produced liquid input/Service liquid output from attribute tag | Primary or Secondary | Ultrasonic testing including forms and schedule |
| Building Mech/Elect/Plumb: | | | | |
| HVAC Chiller geo located | Stainless Steel with attribute tag information | Water/Gas input | Primary or Secondary Cooling/ Heating | Visual/ pressure testing including forms and schedule |
| Emergency generator geo located | Package unit with attribute tag information | Diesel input/ electrical output | Emergency Power | Visual/ load bank testing with forms and schedules |
| 3" Fire Suppression system geo located | Steel with attribute tag information | Water/ Chemical | Fire Safety Subsystem | Visual/ pressure testing including forms and schedule |

TABLE I-continued

Exemplary MIP Applications

| Size | Material | Service | Subsystem | Inspection |
|---|---|---|---|---|
| Electrical Substation: | | | | |
| High Voltage Switches geo located | Copper with attribute tag information | High voltage electrical current | 800,000 volt subsystem | Visual/Auditory testing including forms and schedule |
| Transformer geo located | Package unit with attribute tag information | Step down voltage | 240,000 volt subsystem | Oil analysis/voltage drop including forms and schedule |
| Insulators geo located | Glass/Carbon | Transmission system | 240,000 volt subsystem | Visual/voltage testing including forms and schedule |
| Bridge | | | | |
| 12' wide vehicular lanes across a span | Concrete, rebar | Load and deflection | Deck | Visual and ground penetrating radar |
| Girders | Steel | Load and strain | Superstructure | Visual and Strain gauge |
| Pier | Concrete, Rebar | Load and compression | substructure | Visual |
| Railroad | | | | |
| Commuter rail station | Concrete, steel, glass, electrical | Accessibility | electronic information system | visual and electrical testing |
| Rail | Steel | Load and alignment | ballast | Visual |
| Overhead catenary | Steel | electric | energy | visual and electrical testing |

Figure 5A:
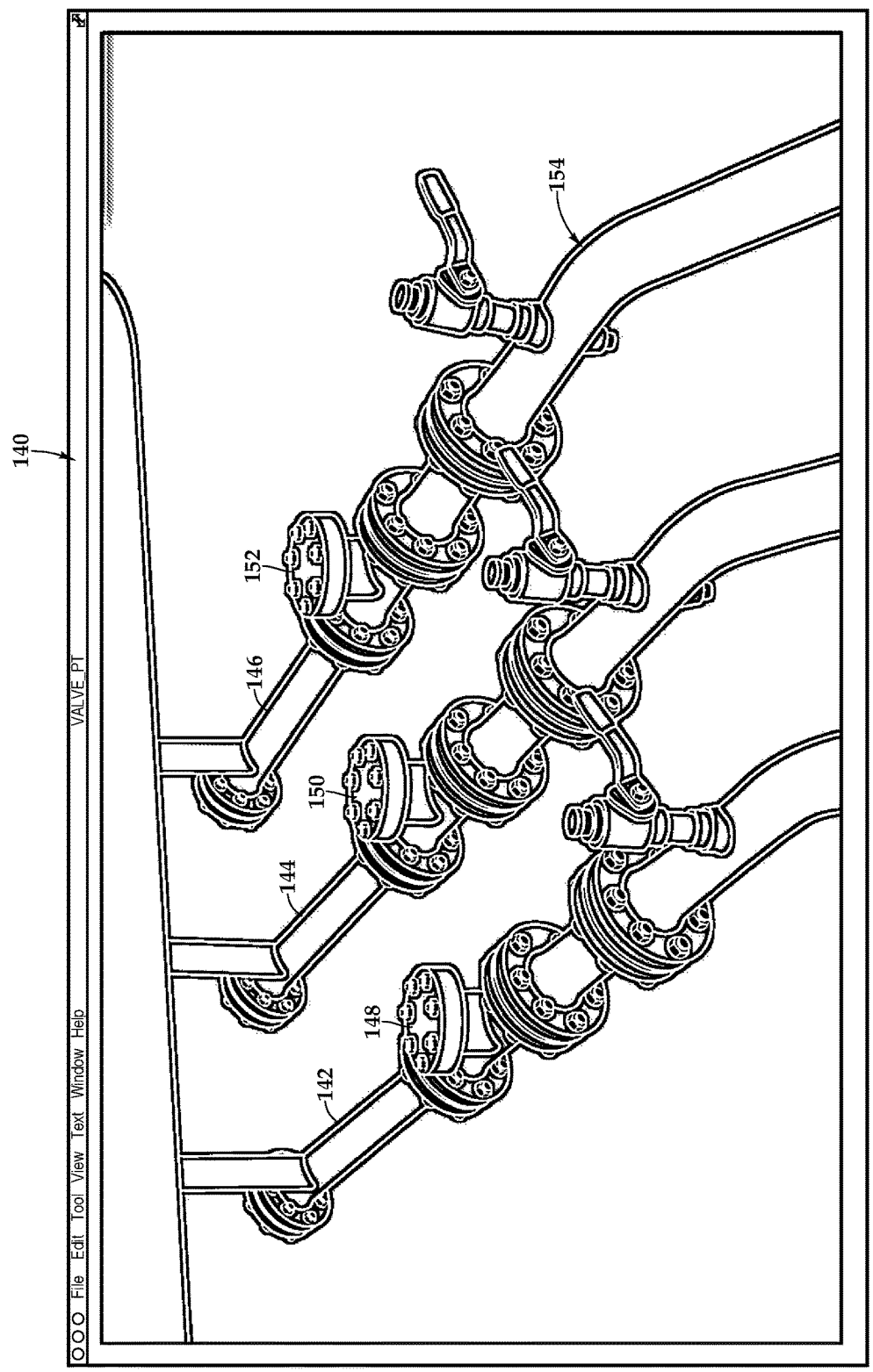
FIG. 5A through FIG. 5H are exemplary screenshots from an interface of the system for visualization of a mechanical integrity program being utilized at an as-built oilfield production site.
Figure 5B:
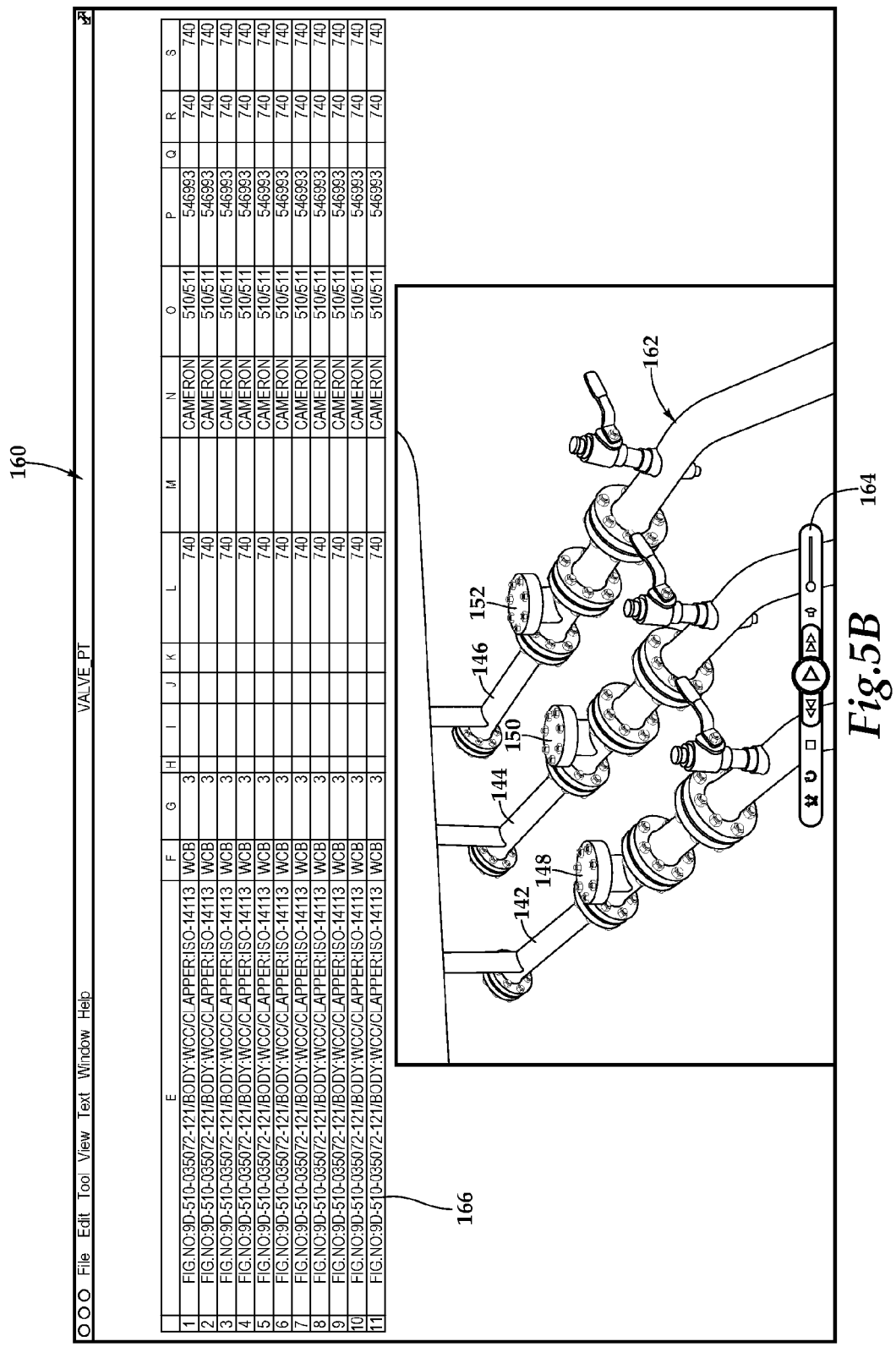

FIG. 5A through FIG. 5H depict exemplary screenshots from an interface of the system 10 for visualization of the MIP being utilized at the as-built oilfield production site 12. More specifically, FIG. 5A depicts a screenshot 140 showing pipes 142, 144, 146 and respective valves 148, 150, 152. Such components form a portion of the oil field production site of FIG. 1. The screenshot 140 shows point cloud data 154 being imported and processed by the MIP server. Referring now to FIG. 5B, screen shot 160 also depicts the pipes 142, 144, 146 with respective valves 148, 150, 152 following the capturing of digital imagery such as spherical photography in an imagery format 162. A menu 164 within the MIP provides for playing fast-forwarding, rewinding, and other similar functions. Table 166 shows the MIP server identify operational elements of the as-built site as part of building the composite model file. Further, table 166 illustrates identifying the interconnection of the operational elements of the as-built site and identifying the instrumentation of the as-built site.

Figure 5C:
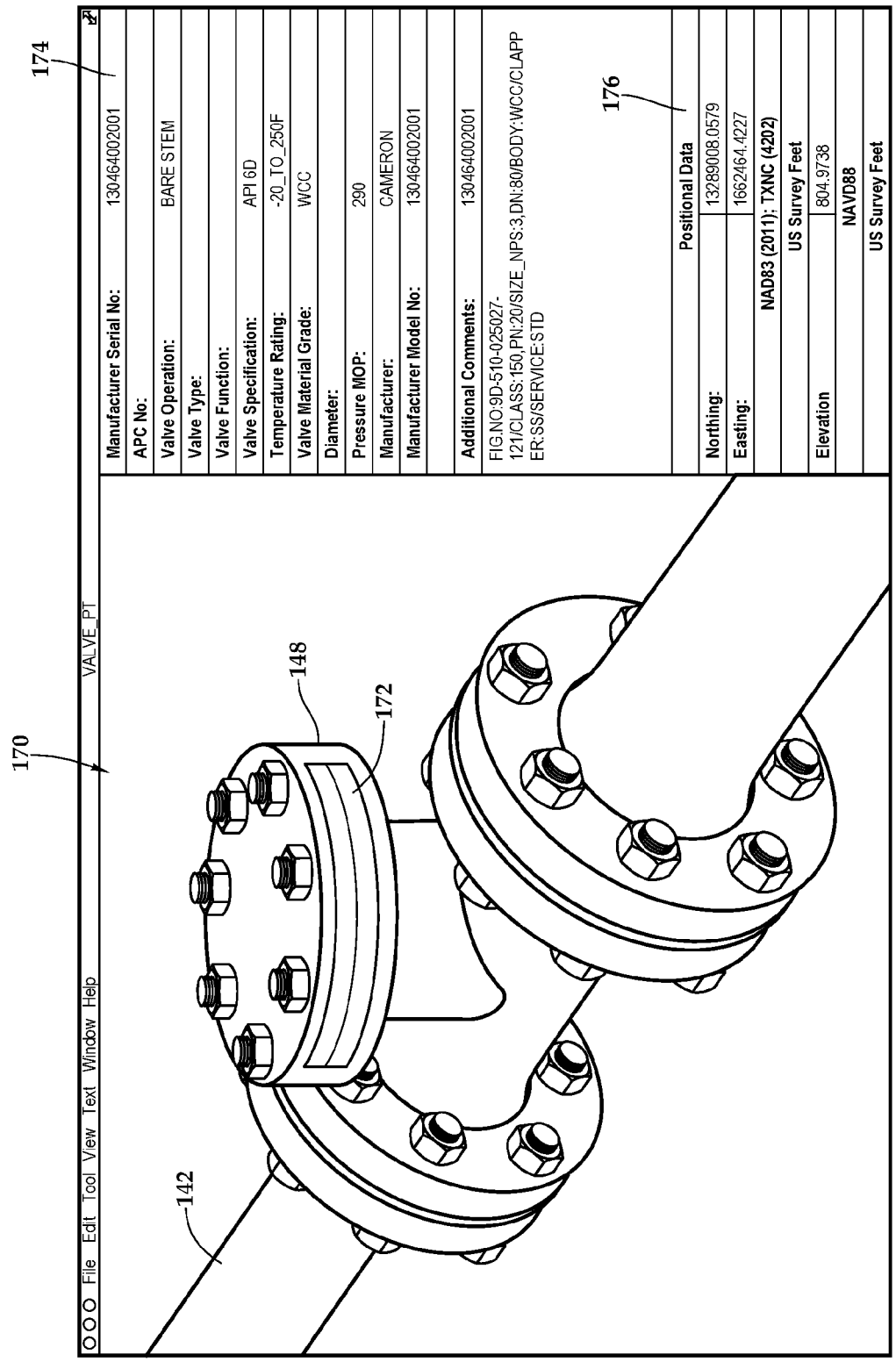
Figure 5D:
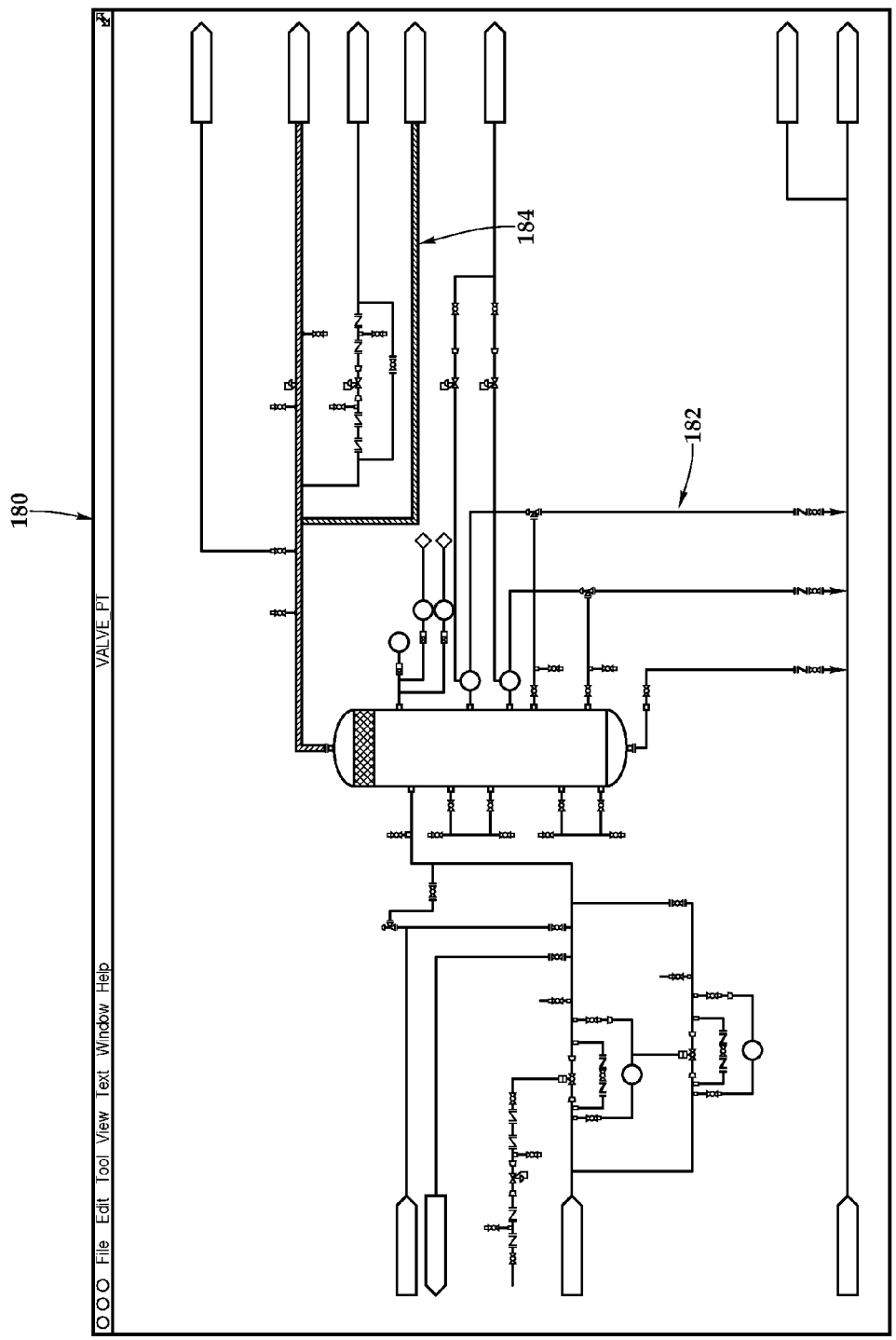
Figure 5E:
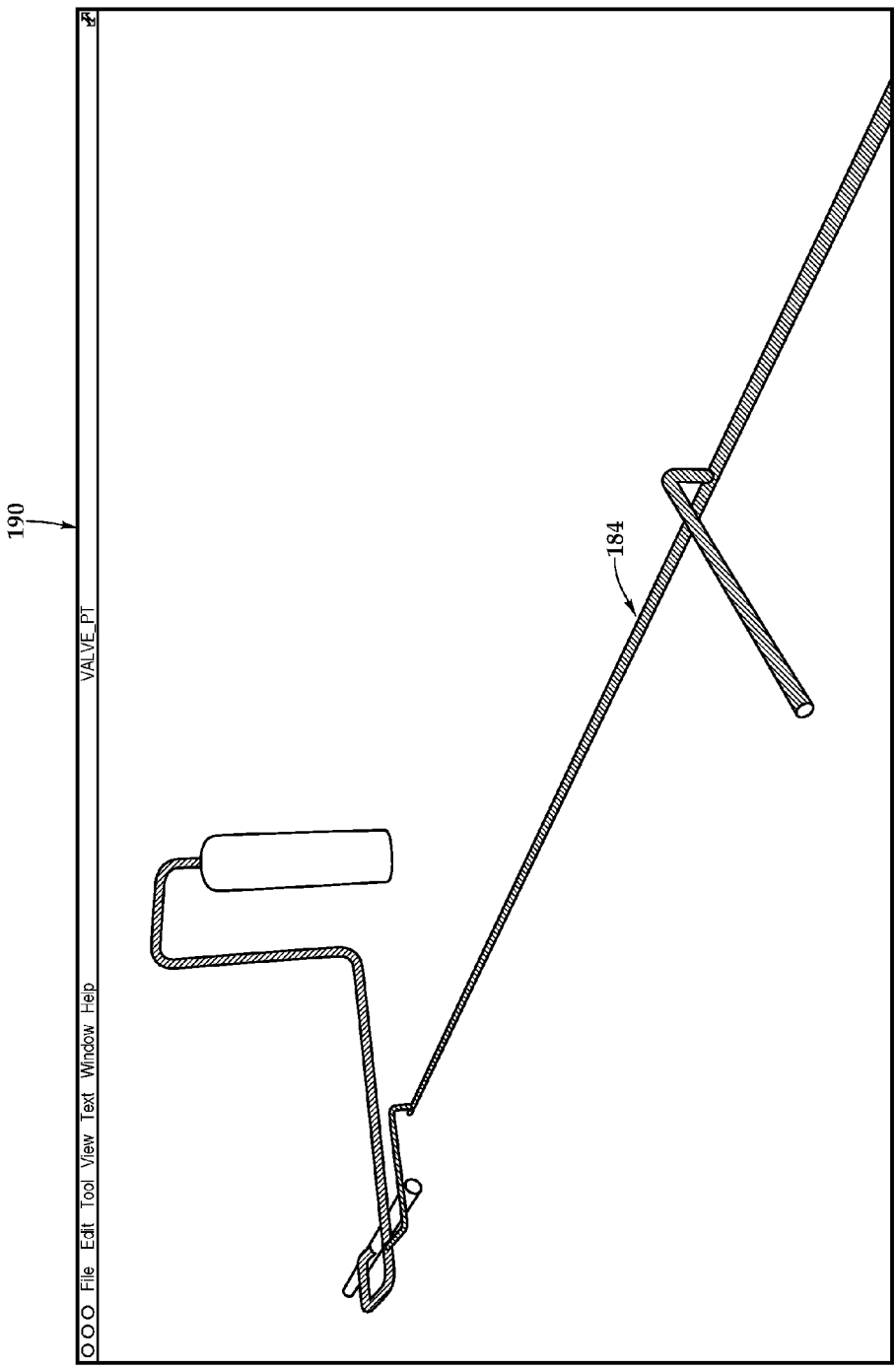

With reference to FIG. 5C, a screenshot 170 depicts a label 172 on the valve 148 of the pipe 142. As shown at label attribute 174, the MIP server creates the label attribute 174 within the composite model file to correspond with the physical label attribute 174 on the operational equipment and instrumentation. Further, in one embodiment, as the imagery is overlayed onto the point cloud data to create the digital representation, positional data 176 is associated with the valve 148. With respect to FIG. 5D, a screen shot 180 depicting a piping and instrumentation diagram (P&ID) 182 is present, wherein a subsystem 184 is being identified and isolated. Thereafter, in FIG. 5E, a screenshot 190 depicts the subsystem 184 isolated in a tree-dimensional view to assist the engineer or inspector who may be on-site.

Figure 5F:
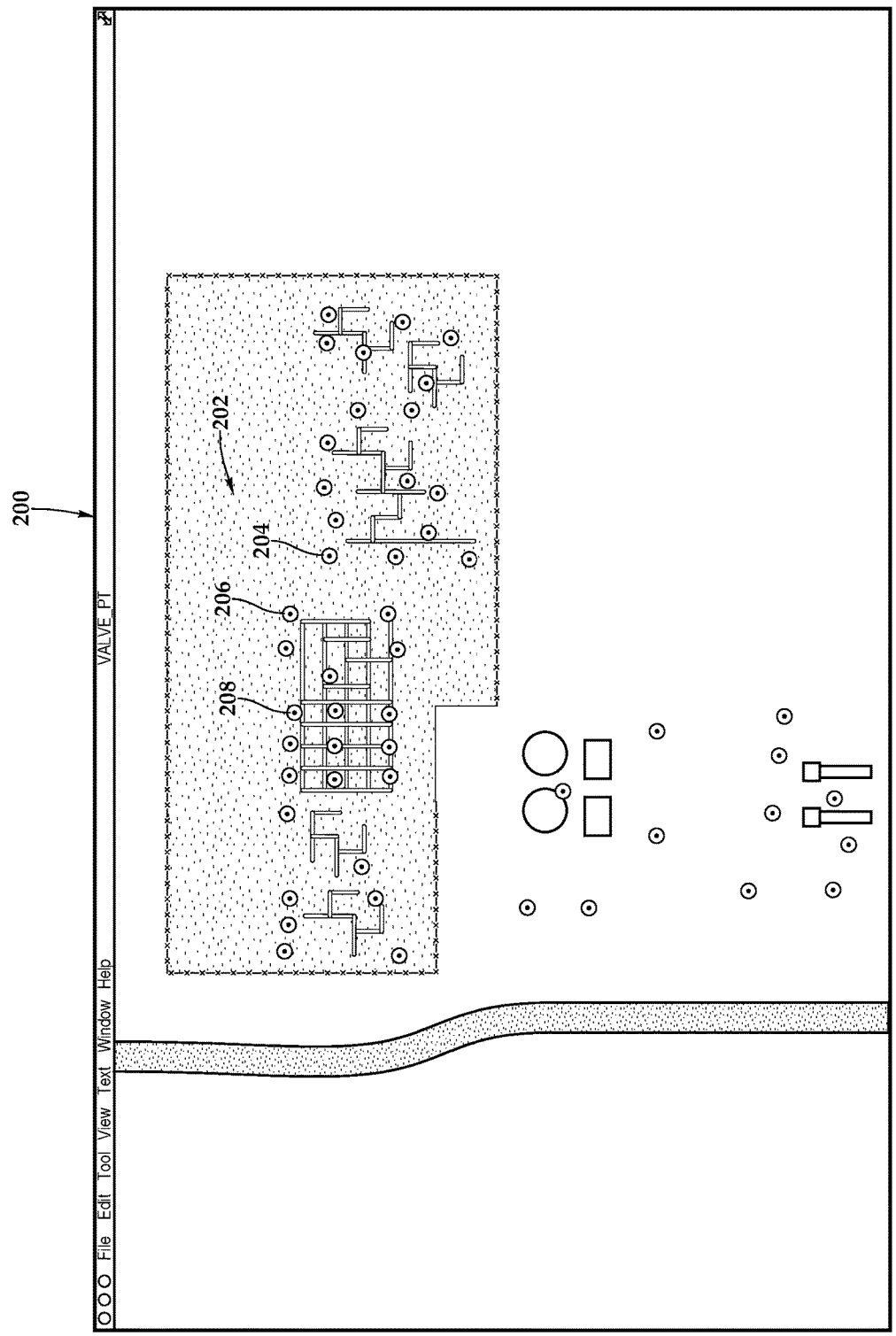
Figure 5G:
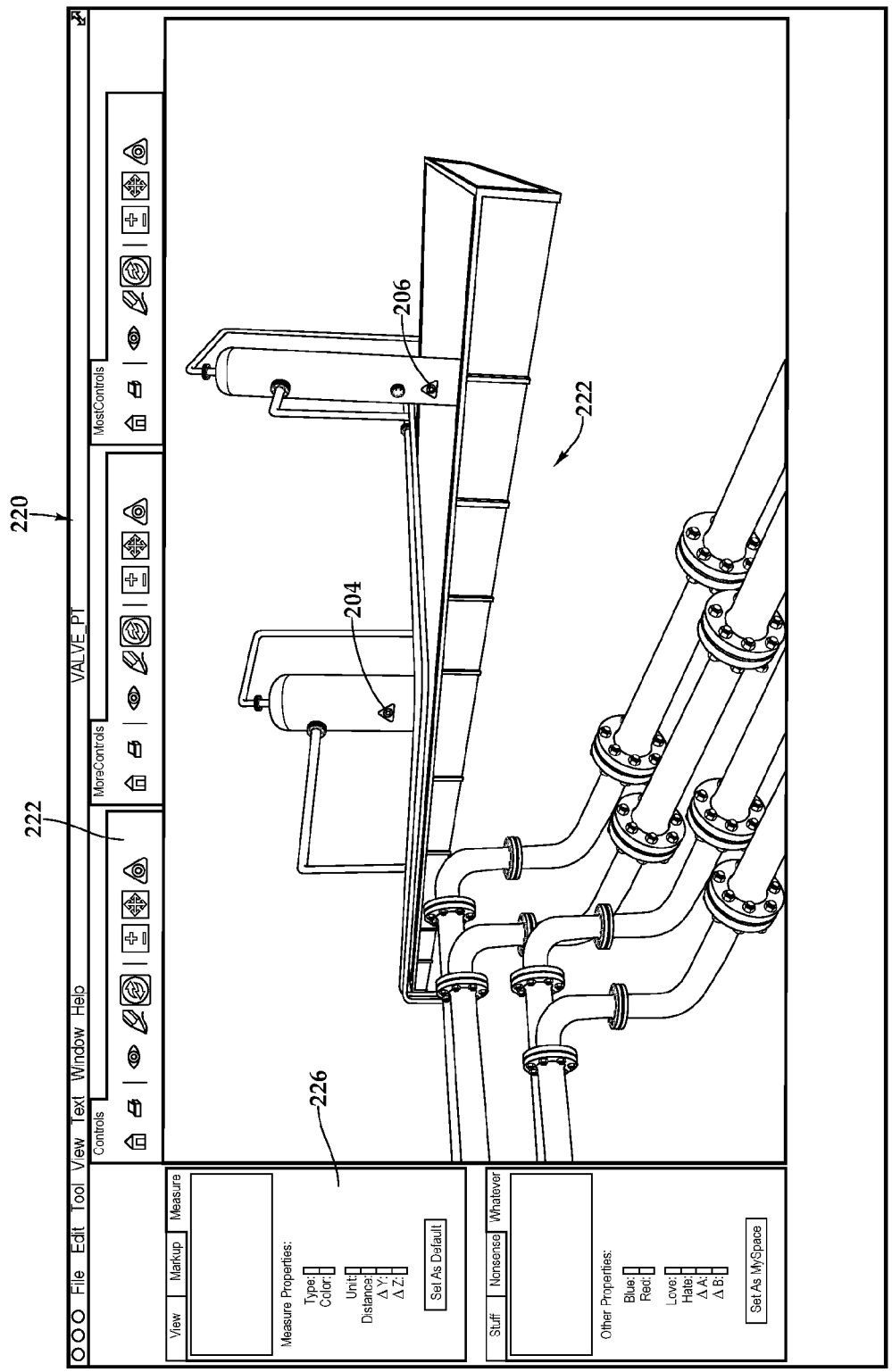
Figure 5H:
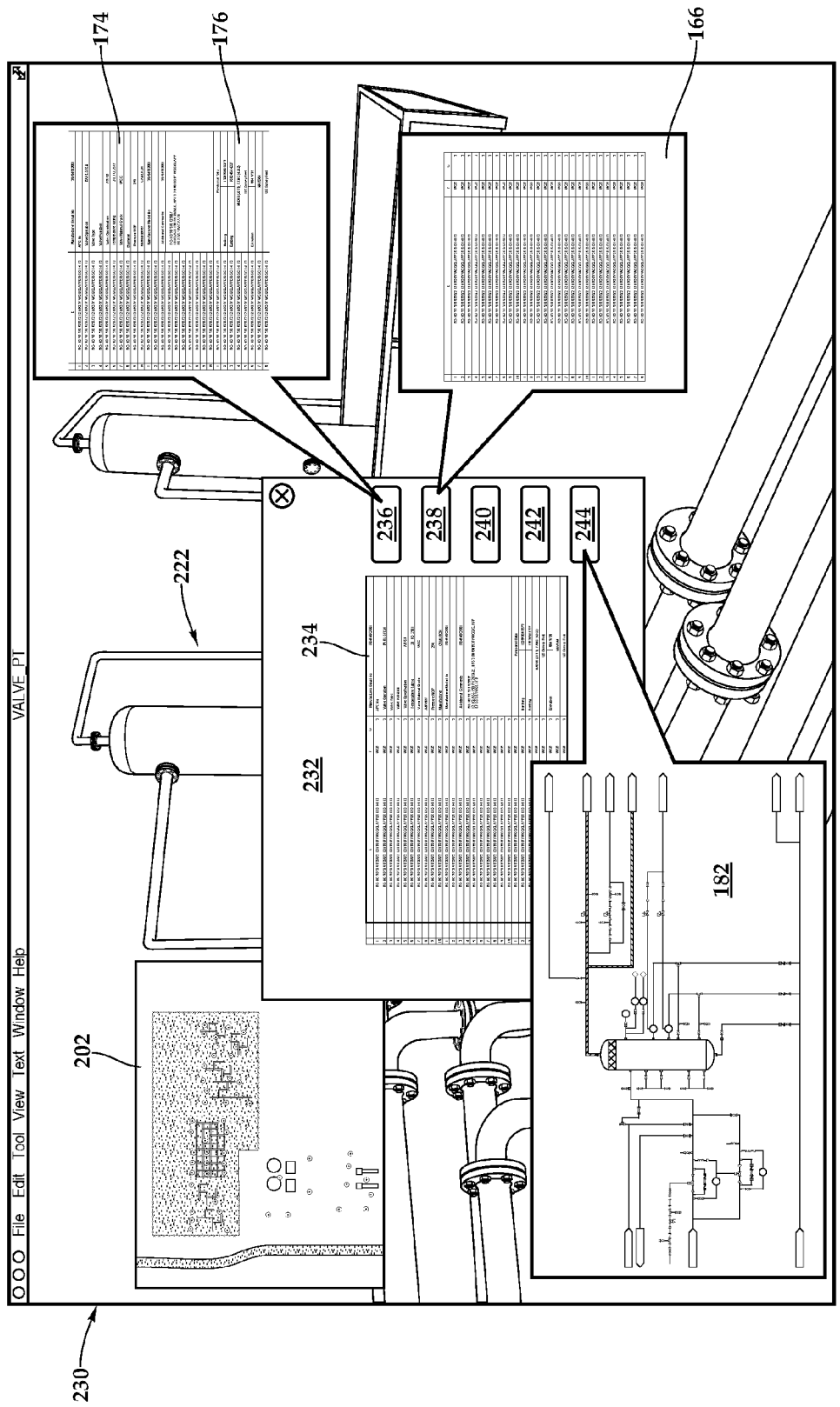

Referring now to FIG. 5F, a screenshot 200 depicts a system map 202 of the as-built oil field production site with various viewer inspection points, such as points 204, 206, 208, integrated into the composite model file. Each of the viewer inspection points 204, 206, 208 is a part of the inspection schedule and represents all points the engineer inspecting the site must examine. Referring to FIG. 5G, a screenshot 220 depicts a first-person three-dimensional (3D) view of the as-built site at the viewer inspection point 208 from FIG. 5F including enhanced inspection points 224, 226, which require inspection. Additional information may be revealed about each enhanced inspection point 224, 226 by touching the point or using the controls 228. In the illustrated embodiment, the digital representation of the as-built site may be made available through a website via the programmable interactive device with the top plan view of FIG. 5F or the point-of-view driven visual demonstration interface of FIG. 5G. Referring now to FIG. 5H, a screen shot 230 is available in the field interface stage via the programmable interactive device. At the viewer inspection point 208 an engineer or field inspector has access to enhanced inspection point 224 having menu 232 including navigatable, user-accessible embedded attributes 234, 236, 238, 240, 242, 244 that show descriptions of the operational element and its interconnectivity as well as, for example, applicable instrumentation 236, a previous enhanced inspection point 238, and a schematic diagram of the instrumentation 244.

The order of execution or performance of the methods and workflows illustrated and described herein is not essential, unless otherwise specified. That is, elements of the methods and workflows may be performed in any order, unless otherwise specified, and that the methods may include more or less elements than those disclosed herein. For example, it is contemplated that executing or performing a particular element before, contemporaneously with, or after another element are all possible sequences of execution.

While this invention has been described with reference to illustrative embodiments, this description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

What is claimed is:

1. A system for visualization of a mechanical integrity program, the system comprising:
   a field acquisition subsystem including laser scanning of a site to collect point cloud data of the site, the field acquisition subsystem including digital imagery of the site to collect imagery of the site;
   an interactive programmable device having a field interface to receive a representation of a mechanical integrity program;
   a mechanical integrity program server configured to provide design, assurance, and verification functions that ensure the site meets appropriate and intended requirements;
   the mechanical integrity program server including a processor, memory, storage, inputs, and outputs;

a busing architecture communicatively interconnecting the processor, the memory, the storage, the inputs, and the outputs;

the inputs and the outputs including a first communication link to the field acquisition subsystem;

the inputs and the outputs including a second communication link to the interactive programmable device; and the memory accessible to the processor, the memory including processor-executable instructions that, when executed, cause the processor to:

process the point cloud data and imagery to create a composite model file, the composite data file being a three-dimensional (3D) representation of the site having geospatial positioning therein, identify operational elements of the site within the composite model file, identify the interconnection of the operational elements of the site within the composite model file, identify the instrumentation of the site used to the control the operational elements within the composite model file, identify and isolate subsystems of the interconnected operational elements and instrumentation of the site within the composite model file, create label attributes within the composite model file, each label attribute corresponding to a physical label on one of the operational equipment and the instrumentation, responsive to user input, generate a mechanical integrity program including processes for assuring the site is in satisfactory condition to safely and reliably perform its intended purpose, the mechanical integrity program including an inspection schedule, integrate enhanced inspection points into the composite model file, each enhanced inspection point being a part of the inspection schedule, provide a first field interface mode configured for viewing on the programmable interactive device, the first field interface mode including a first-person point cloud view of the site having tag attributes and enhanced inspection points therein, provide a second field interface mode configured for viewing on the programmable interactive device, the second field interface mode including a system view of the site having tag attributes and enhanced inspection points therein, provide a third field interface mode configured for viewing on the programmable interactive device, the third field interface mode including a subsystem view of the site having tag attributes and enhanced inspection points therein, provide a transitioning between the first field interface mode, the second field interface mode, and the third field interface mode, receive inspection data relative to the inspection points from the programmable interactive device, and responsive to user input, update the mechanical integrity program based on the inspection data.

2. The system as recited in claim 1, wherein the memory further includes processor-executable instructions that, when executed, cause the processor to:

store in memory multiple raw images obtained from the point cloud data and imagery taken at the site;

process the multiple raw images to reconstruct a dense three-dimensional (3D) model including merged pixels from point cloud data and imagery;

rectify and transforming the dense three-dimensional (3D) model to a site coordinate system including geospatial positioning; and generate the composite model file.

3. The system as recited in claim 1, wherein the interactive programmable device is a computing device selected from the group consisting of smart phones, tablet computers, laptop computers, and desktop computers.

4. The system as recited in claim 1, wherein the second communication link further comprises the Internet.

5. The system as recited in claim 1, wherein the operational elements, interconnection, and instrumentation of the site further comprise components selected from the group consisting of piping and instrumentation elements, building and mechanical elements, electrical elements, plumbing elements, and structured elements.

6. The system as recited in claim 1, wherein the operational elements, interconnection, and instrumentation of the site further comprise piping and instrumentation elements.

7. The system as recited in claim 1, wherein the operational elements, interconnection, and instrumentation of the site further comprise oil field production and processing elements.

8. The system as recited in claim 1, wherein the enhanced inspection points further comprise navigatable, user-accessible embedded attributes.

9. The system as recited in claim 1, wherein the enhanced inspection points further comprise data selected from the group consisting of measured value of operation, measured value modifier of operation, passive readout function, active output function, and function modifier.

10. The system as recited in claim 1, wherein the system view further comprises a top plan view.

11. The system as recited in claim 1, wherein the system view further comprises a first-person point of view.

12. The system as recited in claim 1, wherein the system view further comprises a digital image view based in part on the digital imagery.

13. The system as recited in claim 1, where the site further comprises an as-built site.

14. The system as recited in claim 1, where the site further comprises a site under development.

15. A system for visualization of a mechanical integrity program, the system comprising:

a field acquisition subsystem including laser scanning of the site to collect point cloud data of the site, the field acquisition subsystem including digital imagery of a site to collect imagery of the site;

an interactive programmable device having a field interface to receive a representation of a mechanical integrity program;

a mechanical integrity program server configured to provide design, assurance, and verification functions that ensure the site meets appropriate and intended requirements;

the mechanical integrity program server including a processor, memory, storage, inputs, and outputs;

a busing architecture communicatively interconnecting the processor, the memory, the storage, the inputs, and the outputs;

the inputs and the outputs including a first communication link to the field acquisition subsystem;

the inputs and the outputs including a second communication link to the interactive programmable device, the second communication link including the Internet; and the memory accessible to the processor, the memory including processor-executable instructions that, when executed, cause the processor to:

process the point cloud data and imagery to create a composite model file, the composite data file being a three-dimensional (3D) representation of the site having geospatial positioning therein, identify operational elements of the site within the composite model file, identify the interconnection of the operational elements of the site within the composite model file, identify the instrumentation of the site used to the control the operational elements within the composite model file, the operational elements, interconnection, and instrumentation of the as-built site includes piping and instrumentation elements, identify and isolate subsystems of the interconnected operational elements and instrumentation of the site within the composite model file, create label attributes within the composite model file, each label attribute corresponding to a physical label on one of the operational equipment and the instrumentation, responsive to user input, generate a mechanical integrity program including processes for assuring the site is in satisfactory condition to safely and reliably perform its intended purpose, the mechanical integrity program including an inspection schedule, integrate enhanced inspection points into the composite model file, each enhanced inspection point being a part of the inspection schedule, the enhanced inspection points include navigatable, user-accessible embedded attributes, a portion of the enhanced inspection points including data selected from the group consisting of measured value of operation, measured value modifier of operation, passive read-out function, active output function, and function modifier, provide a first field interface mode configured for viewing on the programmable interactive device, the first field interface mode including a first-person point cloud view of the site having tag attributes and enhanced inspection points therein, provide a second field interface mode configured for viewing on the programmable interactive device, the second field interface mode including a system view of the site having tag attributes and enhanced inspection points therein, provide a third field interface mode configured for viewing on the programmable interactive device, the third field interface mode including a subsystem view of the site having tag attributes and enhanced inspection points therein, provide a transitioning between the first field interface mode, the second field interface mode, and the third field interface mode, receive inspection data relative to the inspection points from the programmable interactive device, and responsive to user input, update the mechanical integrity program based on the inspection data.

16. The system as recited in claim 15, wherein the memory further includes processor-executable instructions that, when executed, cause the processor to:

store in memory multiple raw images obtained from the point cloud data and imagery taken at the as-built site;

process the multiple raw images to reconstruct a dense three-dimensional (3D) model including merged pixels from point cloud data and digital imagery;

rectify and transforming the dense three-dimensional (3D) model to a site coordinate system including geospatial positioning; and generate the composite model file.

17. The system as recited in claim 15, wherein the interactive programmable device is a computing device selected from the group consisting of smart phones, tablet computers, laptop computers, and desktop computers.

18. A system for visualization of a mechanical integrity program, the system comprising:

a field acquisition subsystem including laser scanning of the as-built site to collect point cloud data of a as-built site, the field acquisition subsystem including spherical photography of the as-built site to collect imagery of the as-built site;

an interactive programmable device having a field interface to receive a representation of a mechanical integrity program, the second communication link including the Internet;

a mechanical integrity program server configured to provide design, assurance, and verification functions that ensure the as-built site meets appropriate and intended requirements;

the mechanical integrity program server including a processor, memory, storage, inputs, and outputs;

a busing architecture communicatively interconnecting the processor, the memory, the storage, the inputs, and the outputs;

the inputs and the outputs including a first communication link to a field acquisition subsystem;

the inputs and the outputs including a second communication link to the interactive programmable device, the second communication link including the Internet;

with respect mechanical integrity program server, the memory accessible to the processor, the memory including processor-executable instructions that, when executed, cause the processor to:

process the point cloud data and imagery to create a composite model file, the composite data file being a three-dimensional (3D) representation of the as-built site having geospatial positioning therein, identify operational elements of the as-built site within the composite model file, identify the interconnection of the operational elements of the as-built site within the composite model file, identify the instrumentation of the as-built site used to the control the operational elements within the composite model file, the operational elements, interconnection, and instrumentation of the as-built site includes piping and instrumentation elements, identify and isolate subsystems of the interconnected operational elements and instrumentation of the as-built site within the composite model file, create label attributes within the composite model file, each label attribute corresponding to a physical label on one of the operational equipment and the instrumentation;

responsive to user input, generate a mechanical integrity program including processes for assuring the as-built site is in satisfactory condition to safely and reliably perform its intended purpose, the mechanical integrity program including an inspection schedule, integrate enhanced inspection points into the composite model file, each enhanced inspection point being a part of the inspection schedule, the enhanced inspection points include navigatable, user-accessible embedded attributes, a portion of the enhanced inspection points including data selected from the group consisting of measured value of operation, measured value modifier of operation, passive readout function, active output function, and function modifier, provide a first field interface mode configured for viewing on the programmable interactive device, the first field interface mode including a first-person point cloud view of the as-built site having tag attributes and enhanced inspection points therein, provide a second field interface mode configured for viewing on the programmable interactive device, the second field interface mode including a system view of the as-built site having tag attributes and enhanced inspection points therein, provide a third field interface mode configured for viewing on the programmable interactive device, the third field interface mode including a subsystem view of the as-built site having tag attributes and enhanced inspection points therein, provide a transitioning between the first field interface mode, the second field interface mode, and the third field interface mode, receive inspection data relative to the inspection points from the programmable interactive device, and responsive to user input, update the mechanical integrity program based on the inspection data; and the interactive programmable device user-selectively displaying one of the first field interface mode, the second field interface mode, and the third field interface mode, the interactive programmable device displaying the enhanced inspection points in response to user requests, the interactive programmable device transmitting data relative to the inspection points from the programmable interactive device.

19. The system as recited in claim 18, wherein the memory further includes processor-executable instructions that, when executed, cause the processor to:

store in memory multiple raw images obtained from the point cloud data and imagery taken at the as-built site;

process the multiple raw images to reconstruct a dense three-dimensional (3D) model including merged pixels from point cloud data and imagery;

rectify and transforming the dense three-dimensional (3D) as-built model to a site coordinate system including geospatial positioning; and generate the composite model file.

20. The system as recited in claim 19, wherein the interactive programmable device is a computing device selected from the group consisting of smart phones, tablet computers, laptop computers, and desktop computers.

21. The system as recited in claim 19, wherein the interactive programmable device further comprises a wireless-enabled interactive programmable device.

22. The system as recited in claim 19, wherein at least a portion of the first field interface mode, the second field interface mode, and the third field interface mode are pre-loaded.

* * * * *